US 6,742,160 B2

(12) United States Patent
Greiner

(10) Patent No.: US 6,742,160 B2
(45) Date of Patent: May 25, 2004

(54) CHECKERBOARD PARITY TECHNIQUES FOR A MULTI-PUMPED BUS

(75) Inventor: Robert J. Greiner, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 406 days.

(21) Appl. No.: 09/783,887

(22) Filed: Feb. 14, 2001

(65) Prior Publication Data

US 2002/0157062 A1 Oct. 24, 2002

(51) Int. Cl.[7] .............................. G06F 11/00; G06F 13/42
(52) U.S. Cl. .......................................... 714/801; 710/105
(58) Field of Search .................................. 714/800–801, 714/757, 4, 52; 710/105; 713/400

(56) References Cited

U.S. PATENT DOCUMENTS

| | | | |
|---|---|---|---|
| 5,067,071 A | * | 11/1991 | Schanin et al. .............. 710/113 |
| 5,517,514 A | * | 5/1996 | Norrie et al. ................ 714/800 |
| 5,548,733 A | | 8/1996 | Sarangdhar et al. |
| 5,568,620 A | | 10/1996 | Sarangdhar et al. |
| 5,581,782 A | | 12/1996 | Sarangdhar et al. |
| 5,615,343 A | | 3/1997 | Sarangdhar et al. |
| 5,796,977 A | | 8/1998 | Sarangdhar et al. |
| 5,844,858 A | | 12/1998 | Kyung |
| 5,903,738 A | | 5/1999 | Sarangdhar et al. |
| 5,919,254 A | | 7/1999 | Pawlowski et al. |
| 5,937,171 A | | 8/1999 | Sarangdhar et al. |
| 5,941,979 A | * | 8/1999 | Lentz et al. ................... 712/33 |
| 5,964,856 A | | 10/1999 | Wu et al. |
| 5,978,869 A | | 11/1999 | Guthrie et al. |
| 5,999,023 A | | 12/1999 | Kim |
| 6,012,118 A | | 1/2000 | Jayakumar et al. |
| 6,092,156 A | | 7/2000 | Schibinger et al. |
| 6,108,736 A | | 8/2000 | Bell |
| 6,405,271 B1 | | 6/2002 | MacWilliams et al. |
| 2002/0152343 A1 | * | 10/2002 | Porterfield ................... 710/240 |

FOREIGN PATENT DOCUMENTS

WO  WO 99/36858  7/1999

OTHER PUBLICATIONS

TDB–ACC–NO: NN9405389 IBM Technical Disclosure Bulletin Protocol Extensions to Microprocessor Memory Bus to Support Extend Extended Address Space May 1, 1994.*
Shanley, Tom, MindShare, Inc. "Pentium® Pro And Pentium® II System Architecture", Second Edition, PC System Architecture Series, pp. 199–375.
Intel Corporation, "Accelerated Graphics Port Interface Specification," Revision 1.0, Jul. 31, 1996.
Intel®, Pentium® II Processor Developer's Manual, Chapters 1–6, Oct. 1997.
Intel Corporation, *"Intel Multibus® Specification"*, 1978.
Intel Corporation, *"Multibus® II Bus Architecture Specification Handbook,"* 1984.
Intel Corporation, *"High–Performance Synchronous 32–Bit Bus: Multibus II,"*.

* cited by examiner

Primary Examiner—Albert Decady
Assistant Examiner—Cynthia Britt
(74) Attorney, Agent, or Firm—Jeffrey S. Draeger

(57) ABSTRACT

Checkerboard parity techniques are disclosed. In one embodiment, a bus agent has a multi-pumped interface to generate in N elements in N phases. Each element includes N sub-elements, each sub-element being a fixed portion of an element. A parity generation circuit generates parity signals that are each a function of N sub-elements, a different sub-element from each phase.

26 Claims, 11 Drawing Sheets

CHECKERBOARD PARITY TECHNIQUES FOR A MULTI-PUMPED BUS

BACKGROUND

1. Field

This disclosure generally relates to parity or error correction techniques for a multi-pumped bus architecture and protocol.

2. Description of Related Art

Parity techniques have long been used to improve the reliability of signal transfer between bus agents. Bus agents such as processor have traditionally transmitted parity or error correction bits for data elements at the same rate as data elements and/or at the same time as these data elements. For example, some Pentium® processors such as the Pentium Pro® processor, Pentium® II processor, and the Pentium® III processor (hereafter "P6 bus protocol processors") from Intel Corporation may be configured to transfer data error correction signals using such prior art techniques.

Various details of the bus protocols for the P6 bus protocol processors are found in the Pentium Pro® processor, Pentium® II processor, and the Pentium® III processor Family Developer's Manuals. For example, the P6 bus protocol is described in the Pentium® II Processor Developer's Manual (see, e.g., Chapter 3), October, 1997, Intel document number 243502-001, available from Intel Corporation of Santa Clara, Calif. Some P6 bus protocol processors transmit data error correction signals and address parity signals using a common clock protocol at the same frequency as data signals are transmitted. Such a technique allows data parity to be computed and transmitted with each set of data signals.

Other processors have altered the data transfer protocol by increasing the data transfer rate using a double-pumped, source synchronous protocol. See, for example, PCT publication WO 99/36858. Such processors may also transfer error correction information in a double pumped manner. Using double pumped techniques to also transmit error correction information allows full correction information to be transmitted with each data transfer, but also requires another set of high speed (double pumped) signals to transmit the parity or error correction information and requires parity or error correction generation and checking circuitry that can operate sufficiently fast to support double-pumped transmission of parity information.

BRIEF DESCRIPTION OF THE DRAWINGS

The present invention is illustrated by way of example and not limitation in the figures of the accompanying drawings.

DETAILED DESCRIPTION

The following description provides checkerboard parity techniques. In the following description, numerous specific details such as logic implementations, sizes and names of signals and buses, types and interrelationships of system components, and logic partitioning/integration choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement appropriate logic circuits without undue experimentation.

I. Introduction

According to an embodiment, a processor bus is connected to a plurality of bus agents. Some types of signals are transmitted using a common clock signaling mode while other types of signals are transmitted using a multi pumped signaling mode.

In a common clock signaling mode, signals (such as control signals) can be driven onto the bus at a rate that is substantially the same as the frequency of a common bus clock. In this mode, the edges of the bus clock identify points for sampling the signals driven onto the bus.

Bus throughput can be increased by driving information elements (e.g., address or data) onto the bus by a driving agent at a rate that is a multiple of the frequency of the bus clock. For such multi-pumped information transfer, parity signals may be computed such that parity signals transmitted at the bus clock frequency signal are composite signals that provide parity information for the multiple elements transmitted during a bus clock cycle. As discussed herein, the term "parity" is meant generally to refer to any type of encoding scheme used to generate bits used for the detection or correction of transmission errors.

II. Architecture

Figure 1:
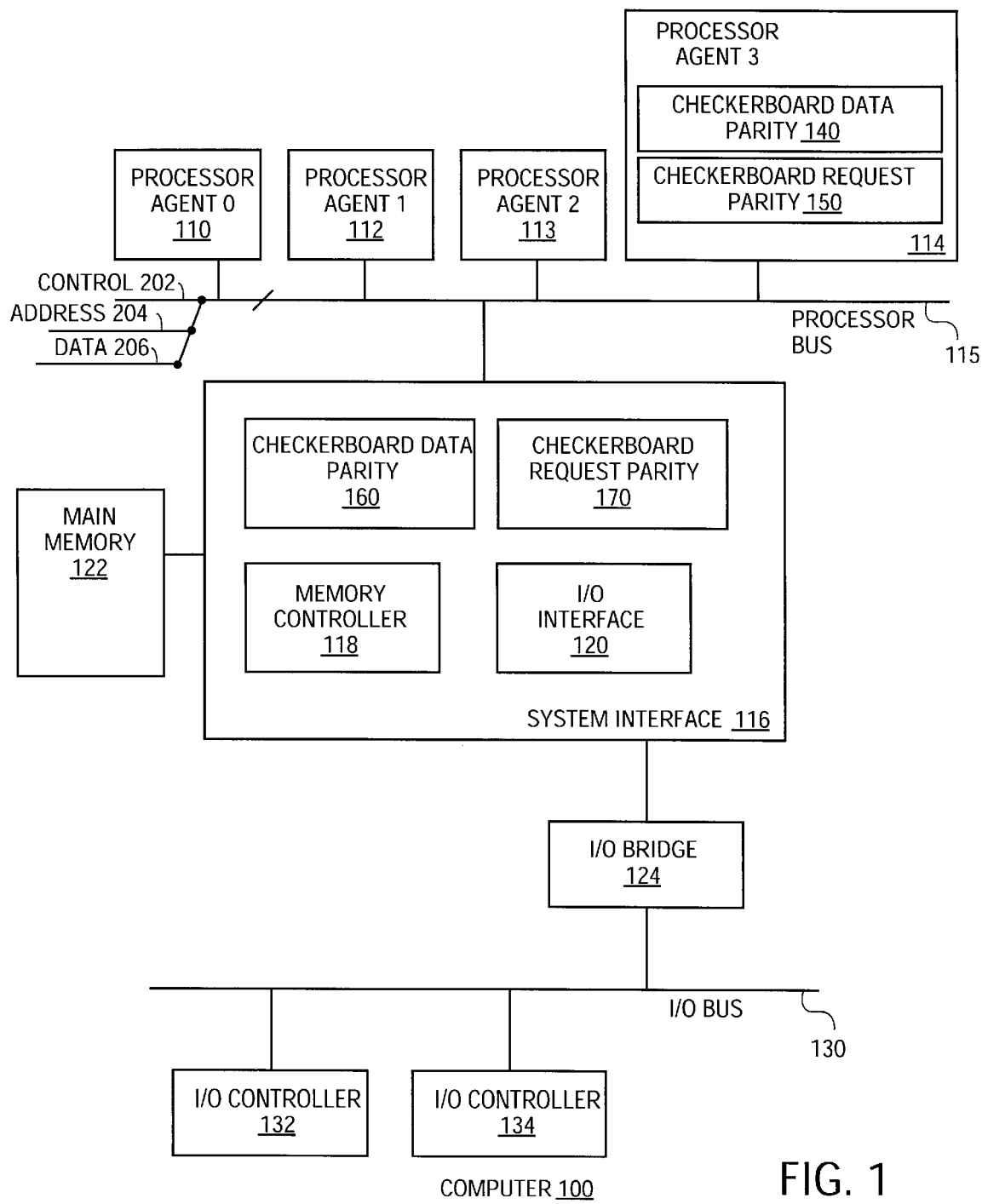
FIG. 1 is a block diagram illustrating a computer according to an example embodiment of the present invention.

FIG. 1 is a block diagram illustrating a computer according to an example embodiment. The present techniques are illustrated with respect to a computer; however, they may be used for any two or more communicating devices. The computer includes one or more processors, including a processor 110, a processor 112, a processor 113, and a processor 114. Each processor also may include one or more internal caches (not shown). As illustrated with respect to processor 114, each processor may contain checkerboard data and address parity circuitry to generate and check parity.

For example, the processor 114 includes a checkerboard data parity circuit 140 and a checkerboard parity circuit 150.

The checkerboard parity circuits provide composite parity or error correction signals computed for multiple sub-phases and different sub-elements from each sub-phase of an information transfer. Such an approach advantageously may in some embodiments reduce the number of signals which need to be transmitted in a high speed and/or multi-pumped manner. As a result, different timing constraints may apply to the parity generation logic and fewer constraints may be required on the routing of the parity signals between components.

Figure 2:
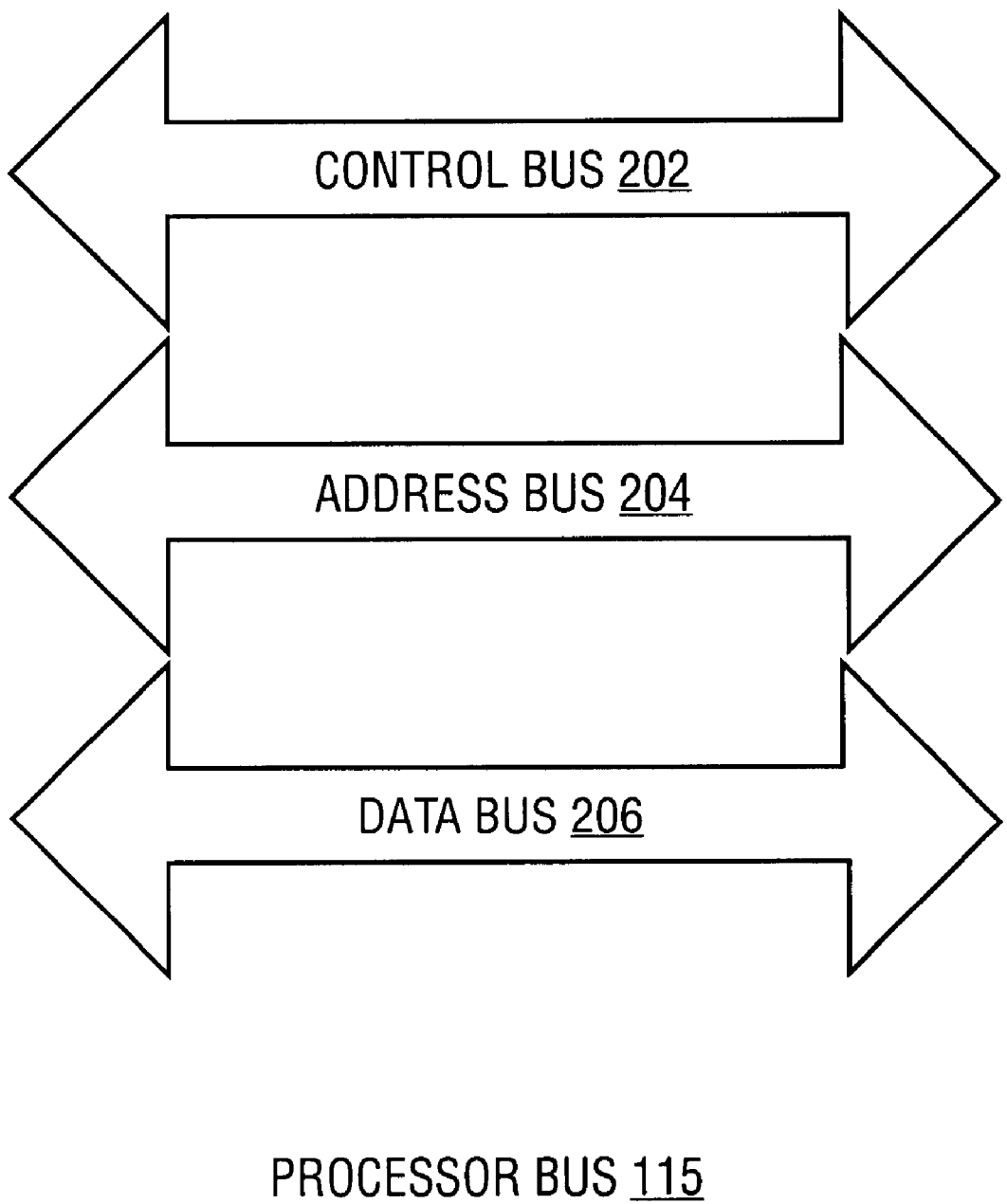
FIG. 2 is a diagram illustrating a processor bus according to an example embodiment.

Each processor is connected to a common processor bus 117 (also known as the host bus or front side bus). FIG. 2 is a diagram illustrating the processor bus 117 according to an example embodiment. As shown in FIG. 2, the processor bus 117 includes a control bus 202, an address bus 204 and a data bus 206. According to an embodiment, the data bus 206 includes many signals, including 64 data lines D[63:0]. The address bus 204 also include many signal including 36 address lines A[35:0]. The address lines may include only address lines A[35:3] in some embodiments with byte enable or other length indicating signals providing address information that may otherwise be transmitted using address pins A[2:0]. The processor bus 117 includes a bus clock (BCLK). The bus clock is commonly provided to agents via the control bus 202 of processor bus 117. The control bus 202 may also includes many additional signals. The address bus 204, control bus 202 and data bus 206 may be multidrop bidirectional buses. According to an embodiment, the term "multidrop" means that the buses are connected to three or more bus agents, as opposed to a point-to-point bus which is connected only between two bus agents. In many embodiments (e.g., single processor systems), however, the front side bus may be a point-to-point bus which couples a processor to a system interface (or chipset) bus agent.

A system interface 116 (or chipset) is also connected to the processor bus 117 to interface several other components to the processor bus 117. System interface 116 includes a memory controller 118 for interfacing a main memory subsystem 122 to processor bus 117. The main memory subsystem 122 typically includes one or more memory cards and a control circuit. System interface 116 also includes an input/output (I/O) controller 120 to interface one or more I/O bridges or I/O devices to the processor bus 117. In the example computer shown in FIG. 1, the I/O controller 120 interfaces an I/O bridge 124 to the processor bus 117. I/O bridge 124 operates as a bus bridge to interface between system interface 116 and an I/O bus 130. One or more I/O controllers and I/O devices can be connected to the I/O bus 130, such as I/O controller 132 and I/O controller 134, for example. I/O bus 130 may be a Peripheral Component Interconnect (PCI) bus or other type of I/O bus.

The system interface 116 also includes a checkerboard data parity circuit 160 and a checkerboard address parity circuit 170. When the system interface (or chipset) 116 drives the request and/or data signals on the bus 115, the chipset generates appropriate parity signals and the processor(s) check the parity, and when a processor drives request and/or data signals on the bus 115, the chipset checks the parity. An error may be signaled using known or otherwise available techniques to signal the system that an error has occurred when data or address signals do not have the expected parity. In some systems, errors may be corrected, depending on the type and amount of information transmitted as parity information.

III. Agents

Bus agents issue transactions on the processor bus 117 to transfer data and system information. A bus agent is any device that connects to the processor bus 117. There may be several classifications of bus agents:

1) Central Agent: handles reset, hardware configuration and initialization, special transactions and centralized hardware error detection and handling. An example is a processor.
2) I/O Agent: interfaces to I/O devices using I/O port addresses. Can be a bus bridge to another bus used for I/O devices, such as a PCI bridge.
3) Memory Agent: provides access to main memory, such as memory controller 118.

A particular bus agent can have one or more of several roles in a transaction:

1) Requesting Agent: The bus agent that issues the transaction.
2) Addressed Agent: The agent that is addressed by the transaction. Also called the Target Agent. A memory or I/O transaction is addressed to the memory or I/O agent that recognizes the specified memory or I/O address. A deferred reply transaction is addressed to the agent that issued the original transaction.
3) Snooping Agent: A caching bus agent that observes ("snoops") bus transactions to maintain cache coherency.
4) Responding Agent: The agent that provides the response to the transaction (typically the addressed agent). According to an embodiment, the responding agent drives the response onto the control bus using the response signals RS[2:0].

IV. Operations, Transactions and Phases

According to an embodiment, bus activity on the processor bus 117 is hierarchically organized into operations, transactions and phases. Additionally, some phases which are multi-pumped may have multiple sub-phases which may also be referred to as phases at times, as will be made clear by the context.

An operation is a bus procedure that appears atomic (e.g., appears to be indivisible or appears to happen at one time) to software even though it may not be atomic on the bus 117. An operation may consist of a single bus transaction, but sometimes may involve multiple bus transactions or a single transaction with multiple data transfers. Examples include a read operation, a write operation, a locked read-modify-write operation and deferred operations.

A transaction is the set of bus activities related to a single bus request. A transaction begins with bus arbitration, and the assertion of the ADS# signal (indicating that an address is being driven) and a transaction address. Transactions are driven, for example, to transfer data, to inquire about a changed cache state, or to provide the system with information.

A phase uses a specific set of signals to communicate a particular type of information. The phases can include arbitration, request, snoop, response and data phases. Not all transactions contain all phases, and some phases can be overlapped. The arbitration phase is a phase in which the bus agents determine which bus agent will be the next bus owner (an agent owns the bus before issuing a transaction). The request phase is a phase in which the transaction is issued to the bus. The snoop phase is a phase in which cache coherency is enforced. The response phase is a phase in which the addressed or target agent drives a transaction response onto the bus. In the data phase, the requesting or responding or snooping agent drives or accepts the transaction data.

Figure 3:
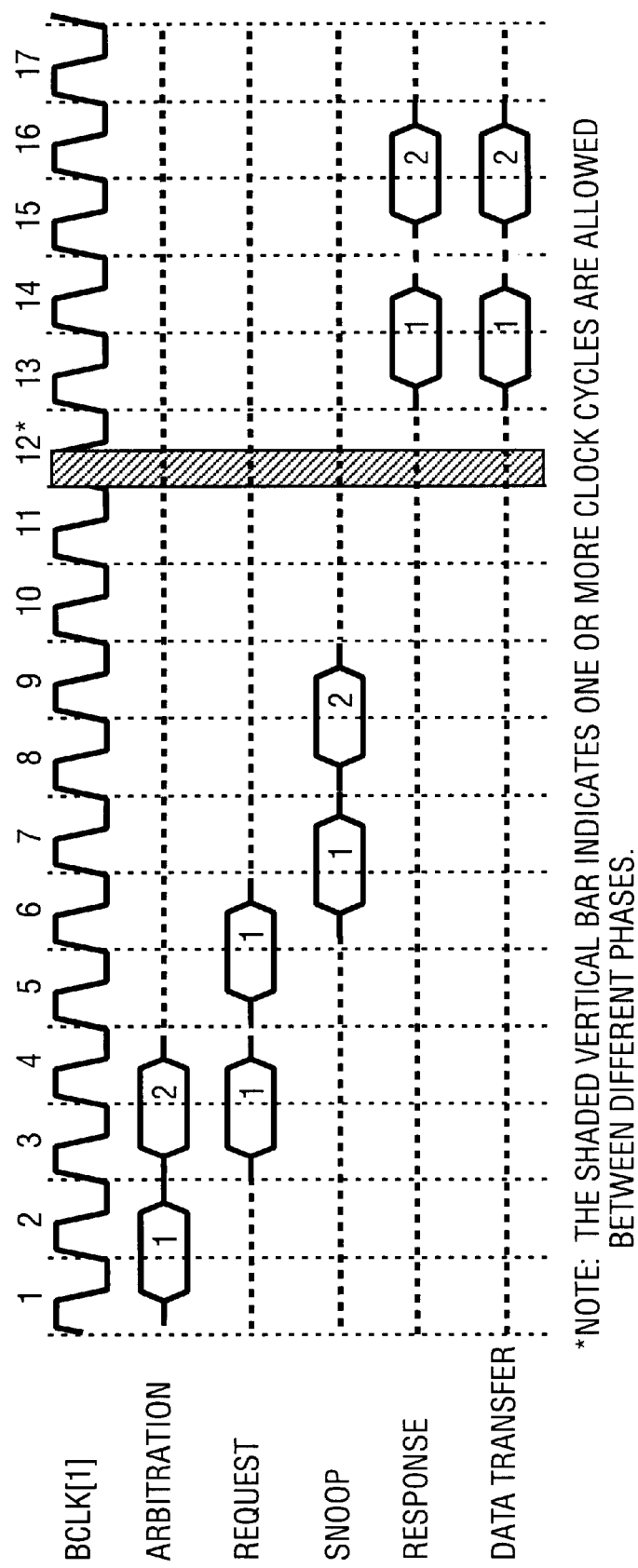
FIG. 3 is a timing diagram illustrating example bus transaction phase relationships for two example transactions according to an embodiment.

FIG. 3 is a timing diagram illustrating example bus transaction phase relationships for two example transactions according to an embodiment. The cycles (1, 2, 3, 4, ... 17) of the bus clock (BCLK [1:0]) are shown at the top. The rectangles having a number 1 indicate various phases for transaction 1, while the rectangles having a number 2 indicate phases for transaction 2. As can be seen from FIG. 3, the transactions are provided in a pipelined fashion. For example, for transaction 1, arbitration occurs in bus clock cycles 1 and 2, request occurs in cycles 3 and 4, snoop occurs in cycles 6 and 7, and response and data transfer occur in cycles 13 and 14. Thus, it can be seen that a response and data transfer may occur many bus clock cycles after the original request phase. Also, there can be overlap between phases of different transactions. For example, the arbitration phase for transaction 2 occurs at approximately the same time as the request phase for transaction 1.

V. Signaling Modes

According to an embodiment, the processor bus 117 is scalable and supports multiple signaling modes. The first is a common clock signaling mode in which all signal activation and sampling or latch points occur with respect to a common bus clock (BCLK#) that is continuously provided between all agents during normal operation. Sampling and driving on the bus clock edge may be approximated by using internal clock signals having convenient rising or falling edges at or near bus clock edges. Common clock signals are driven only once by a bus agent per bus clock cycle and are sampled based on the timing of the bus clock rather than specific strobe signals transmitted in conjunction with the signal being generated. The bus clock is typically generated by a clock chip or clock circuit provided on a motherboard, and is common to all processors or agents which communicate on the processor bus. Signal clocking with respect to the common bus clock is referred to as common clock (1×) signaling mode. According to an embodiment, many control signals provided over the control bus are transmitted using the common clock (1×) signaling mode.

A second signaling mode is a multi-pumped signaling mode which allows an information transfer rate that is a multiple of the transfer rate supported by the common clock signaling mode. Thus, according to an embodiment, the multi-pumped signaling mode can support information transfer over the processor bus 117 between agents at a rate that is a multiple of the frequency of the common (i.e., system) bus clock. For example, the multi-pumped signaling mode may provide for example a double pumped signaling mode which allows information (e.g., data, addresses or other information) to be transferred at twice (2×) the rate of the common clock frequency, or may provide a quad pumped signaling mode which provides for information transfer at four times (4×) the bus clock frequency. To facilitate the transfer of information at such rates or frequencies which are greater than the common bus clock, the driving agent also issues or provides a companion signal known as a "strobe" used by the receiver as a reference for capturing or latching the multi-pumped information.

The term asserted means that a signal is driven to its active level (i.e., driven to a zero for an active low signal), and the term deasserted means the signal is driven to its inactive level or released (not driven at all) to its inactive level by other means (e.g., a pull-up resistor or transistor). A driving window for a data or address element is the time during which the element value is asserted on the bus. The square, circle and triangle symbols are used in some timing diagrams described below to indicate when particular signals are driven or sampled. The square indicates that a signal is driven (asserted, initiated) in that clock cycle. The circle indicates that a signal is sampled (observed, latched) in that clock cycle. The circle is typically used to show a sampling point based on a rising (or falling) edge of the bus clock (BCLK) in the common clock (1×) signaling mode. The triangle indicates that a signal is sampled or captured based on a rising or falling edge of a companion signal, termed a "strobe" The strobe may preferably be on or activated only during the transmission of information (e.g., data, addresses, other information) over the processor bus typically in a multi-pumped mode.

A. Common Clock Signaling Mode

According to an embodiment of the common clock (1×) signaling mode, all agents on the processor bus 117 are required to drive their active outputs and sample required inputs. According to an embodiment, every input should be sampled during a valid sampling interval on a rising edge of the bus clock and its effect or result be driven out onto the bus 117 no sooner than the next rising bus clock edge. This example approach allows one full bus clock cycle for inter-component communication (signal transmission and propagation) and at least one full bus clock cycle at the receiver to interpret the signals and compute and output a response. As a result, after an agent drives data onto the processor bus in one or more bus clock cycles, there is a pause of one bus clock cycle (e.g., a dead cycle or inactive cycle) before another agent can drive the processor bus 117. A setup time for a receiving latch may slightly reduce the time for inter-component communication.

Figure 4:
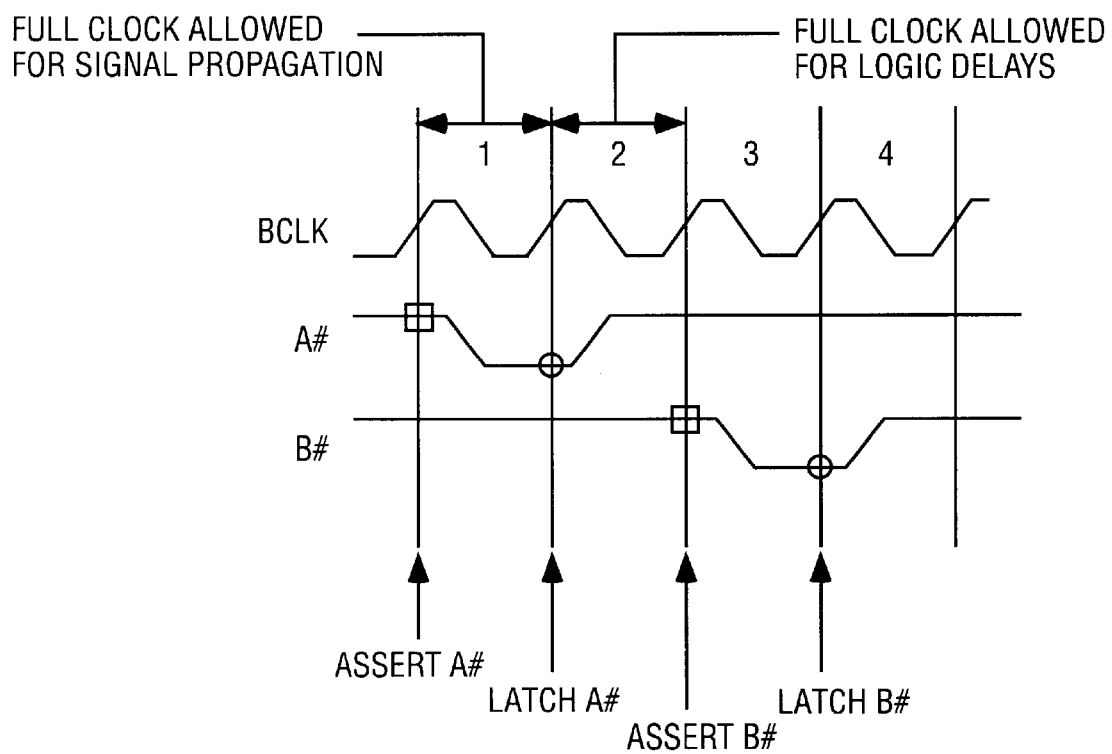
FIG. 4 is an example timing diagram illustrating an example operation of the common clock signaling mode according to an embodiment.

FIG. 4 is an example timing diagram illustrating an example operation of the common clock (1×) signaling mode according to an embodiment. The signals are shown as they may appear on the processor bus 117 (exact timings on the bus may vary). Four cycles of the bus clock (BCLK) are shown. Two additional example signals are also shown, including A# and B#, which may be any type of signals. For example, A# may be a first control signal from a first agent, while B# may be a second signal from a second agent. The first and second control signals may be provided as part of a handshake or bus protocol, for example.

As shown in FIG. 1, the signal A# is driven (or asserted) at or approximately at the rising edge of clock cycle 1 (as shown by the square in A#), and is latched at or approximately at the receiver at a rising edge at the beginning of bus clock cycle 2 (as shown by the circle for A#). Thus, clock cycle 1 is provided for signal propagation. While A# is asserted at the beginning of cycle 1, it is not observed on the bus until the beginning of cycle 2. Then, there is a pause or inactive clock cycle (during bus clock cycle 2 for logic delays and for the receiver to interpret the signals). The receiver then drives or asserts the B# signal at or approximately at the beginning of bus clock cycle 3 (as shown by the square for B#), which are observed and captured by the other agents at or approximately at the beginning of cycle 4 (as shown by the circle for B#).

B. Multi-Pumped Signaling Modes

In many instances, the length of processor bus 117, electrical limitations (including the latency for signal propagation across the bus) may preclude, or make difficult and/or expensive increasing the processor bus frequency. Therefore, according to an embodiment, rather than increasing the entire processor bus clock frequency, the multi-pumped signaling protocol increases the data transfer rate (over the common clock signaling mode) by operating the appropriate bus signal group (e.g., address bus or data bus) at a multiple of the frequency of the bus clock (BCLK).

1. An Example of A Quad Pumped Signaling Mode

In the quad pumped signaling mode, the appropriate bus signal group is operated at four times (4×) the frequency of the bus clock (BCLK). In other words, in quad pumped signaling mode, four elements of information are driven onto the processor bus 117 in one bus clock cycle (which is the time it would take to drive one element of information in the common clock or 1× signaling mode).

Figure 5A:
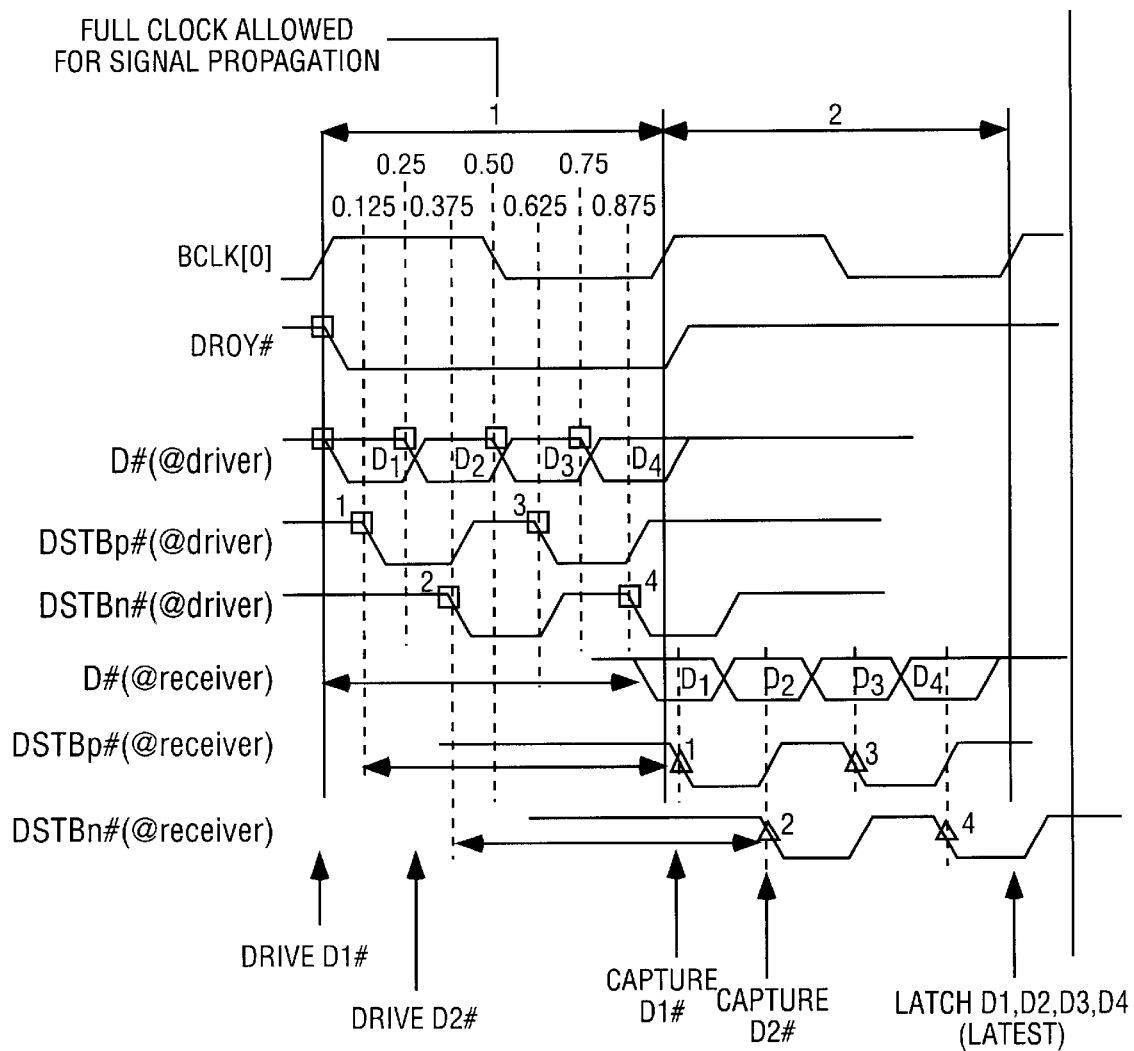
FIG. 5a is a timing diagram illustrating operation of an example quad pumped signaling mode according to an embodiment.

FIG. 5a is a timing diagram illustrating operation of an example quad pumped signaling mode according to an embodiment. Although the quad pumped signaling mode can be used for any type of signals, the quad pumped signaling protocol is used to transmit data according to an example embodiment. Two bus clock cycles and a portion of a third bus clock cycle are shown in FIG. 5a. In one embodiment, a worst case flight time (or signal propagation time) across the processor bus 117 is such that a second information element may be driven onto the processor bus 117 at the driver (i.e., the agent driving information onto the processor bus) before the first information element has been latched at the receiver (receiving agents). In some embodiments, the worst case flight time is less than one bus clock cycle so that the multi-pumped bus may be promptly turned around or used by the receiving agent.

According to an embodiment, the driver (or driving agent) sends or drives a new information element at approximately the start, and approximately the 25%, 50% and 75% points of a signal generation time period. These information elements may be generated from internal clocks of the driving agent and thus may not be precisely aligned with the bus clock signal at any point. Thus, the bus clock signal in FIG. 5a is intended to illustrate a signal generation time period that is equivalent to one cycle of the bus clock. In some embodiments, the elements are driven with only fairly precise relationships to the other elements and strobes and with a less precise relationship to the bus clock. In fact, in some embodiments, the amount of delay from the bus clock is only limited by the requirement that the receiver receive the data within one setup time of the end of the bus clock cycle following the bus clock cycle in which the transfer began. In such embodiments, a shorter flight time to the receiver allows further deviation from alignment of information element generation to the rising edge of the bus clock. In other embodiments, there may be a closer correlation to the bus clock (BCLK), and information elements may be driven at approximately the rising edge and approximately the 25%, 50% and 75% points of a bus clock cycle. Keeping the information elements more closely aligned to the bus clock may allow a system to be designed to have a greater flight time from the generating bus agent to the receiving bus agent.

The driver also sends a companion timing signal known as a data strobe signal that indicates when the receiver should sample or capture the data. The strobe signal is preferably sent or driven (activated) only when information is sent using the multi-pumped signaling mode. Because the data and the strobe signals are generated by the same driver or source, the data and strobes will have the same path. As a result, the strobe signal and the data signals should have the same path and therefore approximately the same delay. Therefore, an advantage achieved by the driver or source sending both a strobe and data is that the data signals and the strobe signal will arrive in-phase (or synchronous) at each agent on the bus 117. Thus, this technique of a driver sending both the data and a timing strobe signal can be referred to as a source synchronous transfer.

In the quad pumped signaling mode, four data strobes (e.g., four timing strobe edges) may be used to identify an information sampling or capture point) in each bus clock cycle, one for each of the four data elements. Unfortunately, problems may arise in generating a strobe signal at relatively high frequencies. At high clock speeds, the difference between the rising edge rate and the falling edge rate can be significant. In addition, it may be difficult to provide a clock signal or strobe signal having a 50% duty cycle. As a result, at some high clock frequencies, using both the rising edge and falling edge of the strobe signal to identify sampling points may create asymmetry or introduce a degree of timing uncertainty. Instead, it may be advantageous to use only one of the two edges of the strobe (i.e., use only the rising edges or only the falling edges of the strobe signals for sampling or capturing the quad-pumped data) to obtain more symmetric or uniform strobe timing or sampling intervals.

Using only one of the edges of the strobe would typically require a clock frequency that is a multiple of the bus clock frequency. In the case of quad pumped data (four data elements per bus clock cycle), the strobe signal frequency should be four times (4×) the bus clock frequency if only one edge is used for timing.

Unfortunately, such high multiples may lead to strobe signals that are much more prone to noise and distortion, which could affect the alignment of the data and strobe at the receiver. Such a misalignment between the transmitted strobe signal and the transmitted data may cause the receiver to capture bad or incorrect data. In addition, signal attenuation can be significantly higher at such high frequencies.

Therefore, according to an embodiment, multiple data strobe signals are used to provide the four strobes per bus clock cycle without using a strobe frequency that is four times (4×) the bus clock frequency. According to an embodiment, two data strobe signals (DSTBp# and DSTBn#) are provided each at twice the frequency of the bus clock. Thus, if the bus clock frequency is 100 MHz, the two data strobe signals will each have a frequency of 200 MHz when activated or generated by the driver (or driving agent). Alternatively, four data strobe signals could be used (each at the same frequency as the bus clock when activated) each providing one strobe or falling edge per bus clock cycle.

Referring again to the timing diagram of FIG. 5a, the driver sends or drives a new information or data element at approximately the rising edge, and the 25%, 50% and 75% points of the signal generation time period (bus clock cycle 1). The data elements are labeled as D1, D2, D3 and D4 for the four data elements in this example. This embodiment also uses two data strobe signals, including DSTBp# and DSTBn#. According to an embodiment, the two data strobe signals are generated out of phase from each other (or in a staggered or offset arrangement). This allows one of the strobe signals to identify sampling points for the odd data elements (e.g., D1, D3, D5, . . . ) and the other strobe signal to be used for the even data elements (e.g., D2, D4, D6, . . . ). The strobes may also be complementary or differential strobes.

Although only two strobe signals are shown in the example of FIG. 5a, any number of strobe signals can be used to identify sampling points for the data of a source synchronous transfer. As noted above, it can be especially advantageous to provide multiple strobe signals so that only one of the two edges of the strobe signals can be used to identify sampling points (or strobes) while lowering the frequency of the strobe signals. For example, if a 6× pumped protocol were used (instead of quad pumped), three strobe signals could be used, where all three strobe signals could be similarly offset or staggered such that strobe 1 could be used for data elements D1, and D4, strobe 2 for data elements D2 and D5 and strobe 3 for data elements D3 and D6, etc.

According to an embodiment, only one of the two edges of the strobe signals are used for identifying or synchronizing data sampling points. In this particular embodiment, only the falling edges of the two data strobe signals are used to identify points for sampling the information or data. The data strobes (or falling edges of the data strobe signals) are centered in each of the four information or data elements. Thus, the four falling edges (or strobes) of the data strobe signals will occur at approximately the 12.5%, 37.5%, 62.5% and 87.5% points of the signal generation time period, which may be the bus clock (BCLK) cycle. Therefore, the two strobe signals provide equally spaced strobes or falling edges.

As shown in FIG. 5a, a DRDY# signal is driven onto the bus 117 at the beginning of bus clock cycle 1 (as shown by the square for DRDY#). DRDY# indicates that valid data has been placed on the processor bus 117 to be sampled or captured. The first data element (D1) is driven by the driver onto the processor bus 117 at the rising edge of bus clock cycle 1 (as shown by the first rectangle for D# (@driver)). A first data strobe signal (DSTBp#) is then activated by the driver at the 12.5% point of the signal generation time period (which is equivalent to one bus clock cycle), as shown by the first square in DSTBp# (@driver). Thus, the strobe (or falling edge) for the first data element (D1) is centered in the first data element. Once a strobe signal has been activated or turned on, it typically continues activated (continues switching) until the all data elements for that transaction have been driven onto the bus. For simplicity, these strobe transitions are shown with respect to the bus clock signal, however, as previously discussed, they may not be precisely oriented to the bus clock cycles in some embodiments, but rather may be oriented to a signal generation time period of the same duration as a bus clock cycle, which may be offset from the bus clock cycles.

Also, a second data element is driven by the driver at approximately the 25% point of the bus clock cycle 1, as shown by the second rectangle for D# (@driver). The second data strobe signal (DSTBn#) is activated at approximately the 37.5% point of bus clock cycle 1 and provides a falling edge (or strobe) that is centered in the second data element (D2).

Likewise, the third and fourth data elements (D3 and D4, respectively) are driven at approximately the 50% point and the 75% point of bus clock cycle 1. Corresponding data strobes (falling edges of the data strobe signals) are driven or provided by the driver at approximately the 62.5% point (by the DSTBp# strobe signal) and approximately the 87.5% point (by the DSTBn# strobe signal). Because the data strobe signals are provided at a frequency that is two times (2×) the frequency of the bus clock, each data strobe signal will provide a strobe or falling edge twice every bus clock cycle. Thus, the DSTBp# strobe signal provides falling edges or strobes at approximately the 12.5% and 62.5% points of the bus clock cycle, while the DSTBp# strobe signal provides falling edges or strobes at approximately the 37.5% and 87.5% points of the bus clock cycle.

Thus, it can be seen that the two data strobe signals (DSTBp# and DSTBn#) are staggered or out of phase with each other. This allows alternating strobe signals to provide a falling edge (or strobe) every quarter of a bus clock cycle (between both data strobe signals). This provides four strobes or falling edges per bus clock cycle for identifying sampling or capturing points for the four data elements per bus clock cycle, while decreasing the frequency of each strobe. Moreover, timing and circuitry is simplified because the same edge (in this example the falling edge) is used as the strobe in each data strobe signal.

According to an embodiment, to ensure correct operation, the latency of the information transfer from the driving agent to any receiver should be less than or equal to one bus clock minus the input latch setup time. This will avoid contention on the data lines for the subsequent data phase if the receiver becomes the bus owner during the next phase.

FIG. 5a also shows the capturing of the data at the receiver. After the signals (data and data strobes) are driven by the driver, these signals propagate down the processor bus 117 and reach the target or receiver. The first data element is received at the receiver, as shown by the D# (@receiver) signal. The first data element (D1) is sampled or captured on the first strobe, which is the first falling edge of DSTBp# (@receiver). The first triangle for the DSTBp# (@receiver) identifies the strobe or point for sampling or capturing the first data element, and the second triangle for the DSTBp# (@receiver) identifies a point or strobe for sampling the third data element at the receiver. Likewise, the two triangles for the second data strobe signal (DSTBn# (@receiver)) identify the points for the receiver to sample or capture the second and fourth data elements (D2, D4).

As shown in FIG. 5a, the first data element D1 may be sampled or captured (strobed) into the receiver after the rising edge at the beginning of clock 2, and no sooner than the 12.5% point of clock cycle 2 (the next clock cycle). The actual time at which these signals are captured at the receiver varies depending on the flight time from the driver to the receiver. As used herein, the terms "capturing", "sampling" and "latching" are loosely used to mean approximately the same thing. However, the data for all data elements may not be latched into the receiver until the rising edge of bus clock cycle 3. Thus, while the data element D1 is received and captured near the beginning of bus clock cycle 2, all the data is not made available to the receiver until the beginning of bus clock cycle 3. The receiving agent may include a FIFO (first in, first out) buffer that is sufficient to store eight data elements. The eight data element FIFO is large enough to store the four elements of one data transfer and the next four elements for the next transfer. This allows four new data elements to be received and captured while the previous four data elements are being popped or latched out from the FIFO to the receiver. The net effect is four times the bandwidth of the common clock signaling mode with the effect of adding latency for the first signal group latched inside the receiver or device.

In addition, according to an embodiment, multiple lines are used to carry multiple copies of each of the two data strobe signals (DSTBp# and DSTBn#). According to an embodiment, there are four DSTBn# signals and four DSTBp# signals, as expressed in the following table.

| Example Embodiment of Data Strobe Coverage | |
|---|---|
| Data Signals | Strobes |
| D[15:0]# | DSTBp0#, DSTBn0# |
| D[31:16]# | DSTBp1#, DSTBn1# |
| D[47:32]# | DSTBp2#, DSTBn2# |
| D[63:48]# | DSTBp3#, DSTBn3# |

The four DSTBp# signals are logically identical, as are the four DSTBn# signals, but each of the data strobe signals is physically routed with a subset of the request signals (i.e., a subset of the data lines) to reduce timing skew or misalignment between the data and the data strobe signals.

Figure 5B:
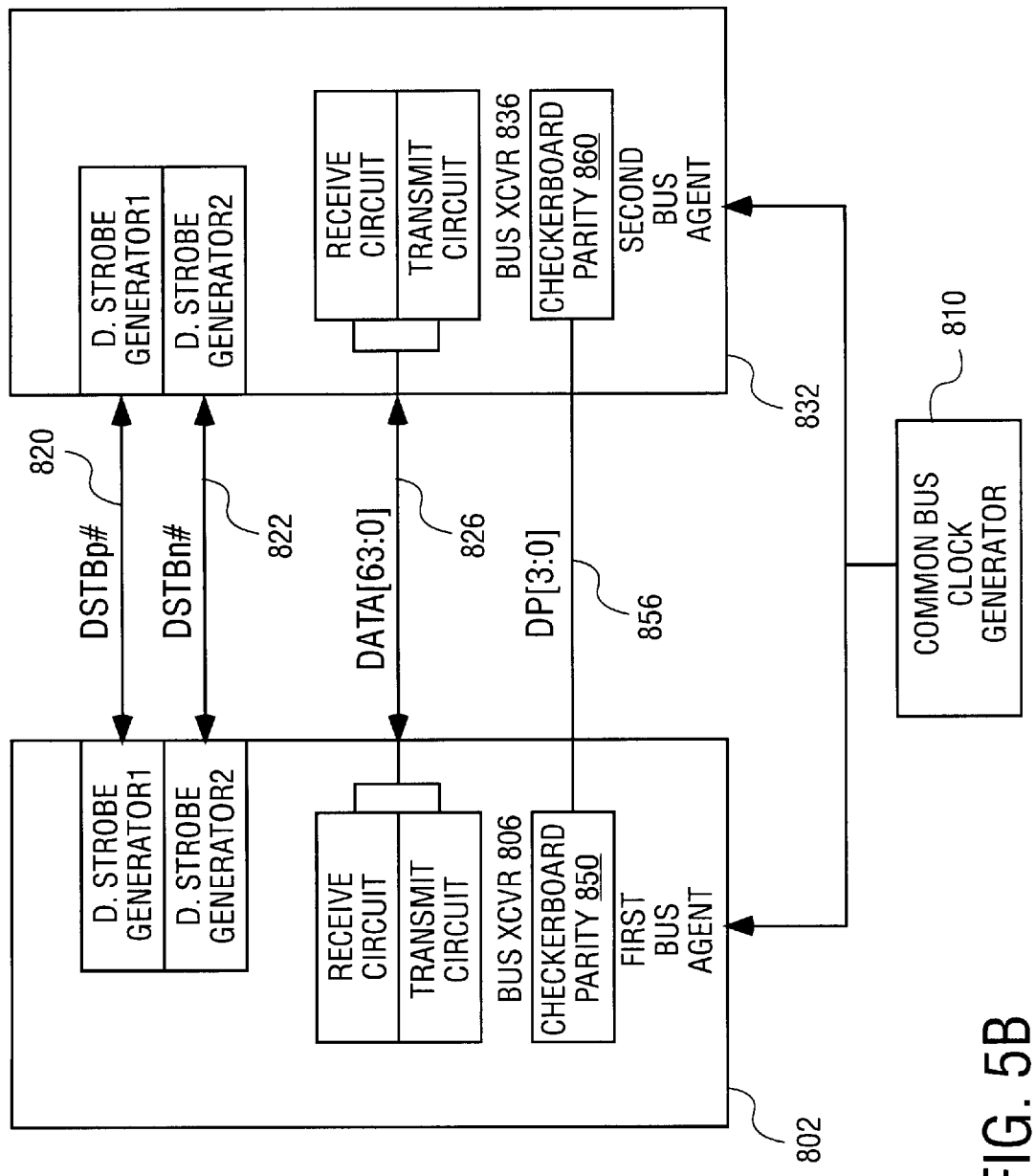
FIG. 5b is a block diagram of an apparatus for multi-pumped transfer of information between agents according to an embodiment.

FIG. 5b is a block diagram of an apparatus for transferring information between agents according to an embodiment. A first bus agent 802 is connected to a second bus agent 832. The first bus agent 802 includes a data strobe generator 1/receiver 1 for generating and receiving a first data strobe signal (e.g., DSTBp#) over a first bidirectional data strobe signal line 820, and a data strobe generator 2/receiver 2 for generating and receiving a second data strobe signal (e.g., DSTBn#) over a second bidirectional data strobe signal line 822. Bus agent 802 also includes a bus transceiver 806 including a transmit circuit for transmitting or driving data signals onto the data bus or data signal lines 826 and a receive circuit for receiving data signals received over the data signal lines 826. The second bus agent 832 similarly includes a data strobe generator 1 and a data strobe generator 2 for generating two data strobe signals onto the data strobe signal lines 820 and 822, respectively. A common (or system) bus clock generator 810 provides the common or system bus clock to bus agents 802 and 832.

Each bus agent 802 and 832 contains a checkerboard parity circuit, respectively checkerboard parity circuits 850 and 860, to generate and check parity signals that in one embodiment are transmitted over a data parity bus 856 according to the common clock protocol.

Request Phase

The request phase is the phase in which the transaction is actually issued or driven to the bus. According to an embodiment the request phase is one common bus clock cycle in duration. The request phase includes two sub-phases, including sub-phase a (during the first half of the request phase) and sub-phase b (during the second sub-phase of the request phase). Request information is transmitted during the request phase, including the transaction address. The request phase begins with the assertion of the ADS# signal, the address strobe signal. Here is an example group of signals that can be used to transmit a request.

EXAMPLE REQUEST SIGNALS

| Pin Name | Pin Mnemonic | Signal Name | Signal Mnemonic | Number |
|---|---|---|---|---|
| Address Strobe | ADS# | Address Strobe | ADS# | 1 |
| Request Command | REQ[4:0]# | Request Extended Request | REQa[4:0]# REQb[4:0]# | 5 |
| Request Strobes | ADSTB[1:0]# | Request Strobes | ADSTB[1:0]# | 2 |
| Address Parity | AP[1:0]# | Address Parity | AP[1:0]# | 2 |
| Address | A[35:3]# | Address Reserved Attributes | Aa[35:3]# Ab[35:32]# ATTR[7:0]# or Ab[31:24]# | 33 |
| | | Deferred ID | DID[7:0]# or Ab[23:16]# | |
| | | Byte Enables | BE[7:0]# or Ab[15:8]# | |
| | | Extended Functions | EXF[4:0]# or Ab[1:0]# | | a. These signals are driven on the indicated pin during the first sub-phase (sub-phase a) of the Request phase.

b. These signals are driven during the second sub-phase (sub-phase b) of the Request phase.

Notably, the term "pin" is meant to be synonymous with the term "interface" in that any type of interface between an integrated signal can and typically is referred to as a pin. Some examples include pins, balls, or other connectors used in integrated circuit or module connection. The term "pin" thus encompasses any known or otherwise available type of interface from one electronic component to another or to a connector such as a circuit board, module, or cable.

Thus, the transaction address is transmitted on Aa[35:3], and additional information (e.g., byte enables, attributes, extended functions) describing the transaction is transmitted on Ab[35:3] (Aa and Ab are transmitted on the same address lines during two sub-phases). The assertion of ADS# defines the beginning of the request phase. In one embodiment ADSTB[1:0]# toggles once in every bus clock cycle that ADS# is asserted, and not in any other cycles. The REQa [4:0]# and REQb[4:0]# signals identify the transaction type.

Figure 6A:
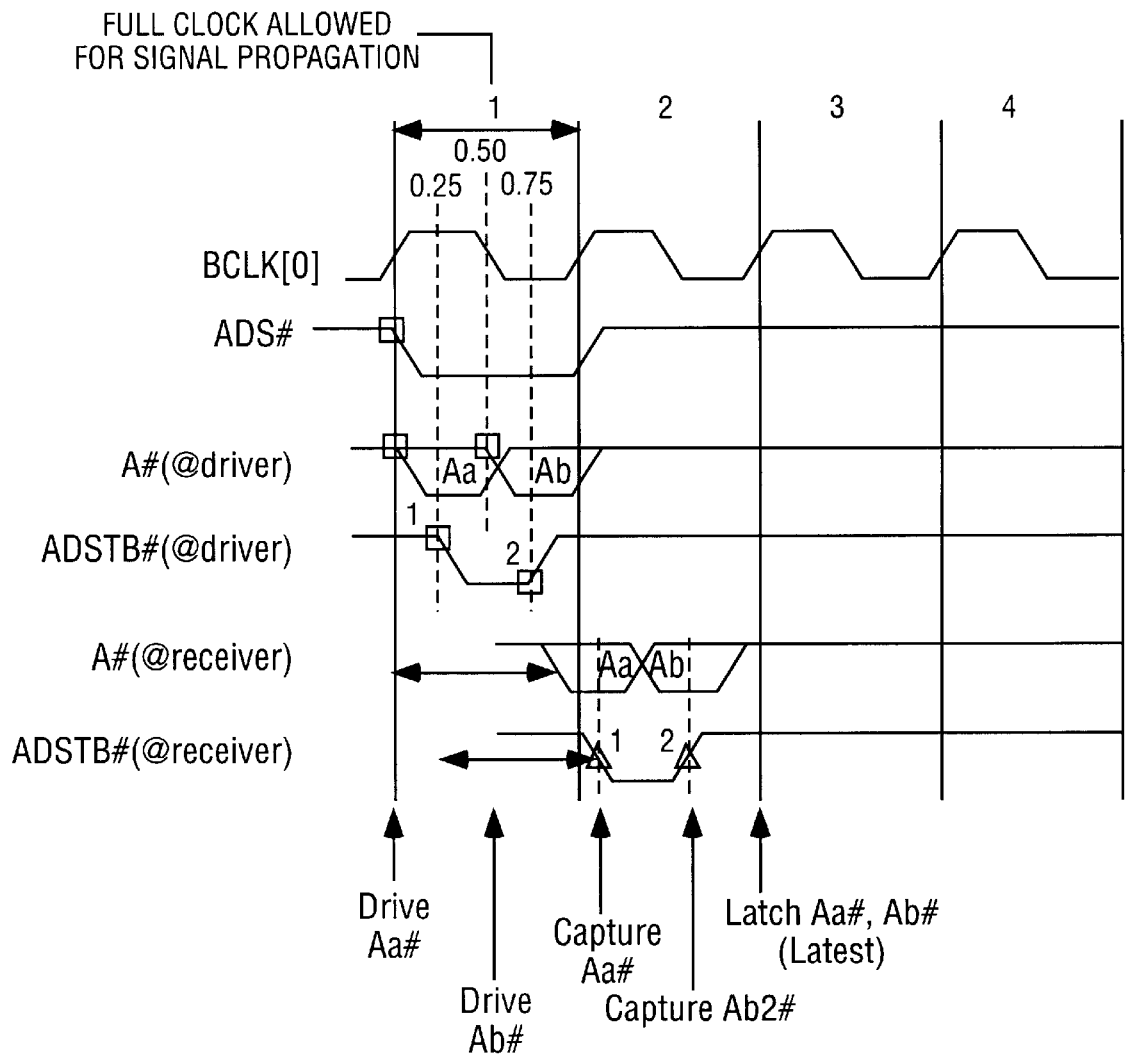
FIG. 6a is a timing diagram illustrating operation of an example double pumped signaling mode according to an embodiment.

In general, according to an embodiment, a double pumped signaling mode operates the appropriate bus signaling group at twice (2×) the frequency of the bus clock (BCLK). FIG. 6a is a timing diagram illustrating operation of an example double pumped signaling mode according to an embodiment. While any signals may be double pumped, the address and request bus is double pumped in this embodiment.

Referring to FIG. 6a, the ADS# signal goes low at the beginning of the request phase. In the double pumped signaling mode, two elements of information are driven onto the bus in the time that it takes to drive one element using the common clock signaling mode (i.e., during one bus clock cycle). Due to flight time (or signal propagation time on the processor bus 117), the second signal group or information element may be driven at the driver before the first element is latched at the receiver(s). According to an embodiment, the driver sends a new information element at approximately the rising edge and the 50% point of the bus clock cycle. As discussed previously with respect to quad-pumped data transfer, in some embodiments, the bus clock signal is used to illustrate a signal generation time period. The multiple address/request elements are transferred in a duration equivalent to a bus clock cycle. For convenience, percentages are given relative to the bus clock signal; however, these may in some embodiments be relative only to a signal generation time period which may vary in its precise relation to the bus clock. Additionally, percentages given are approximate as some variation may be expected.

As shown in FIG. 6a, sub-phase a of the request (Aa) providing the transaction address is sent on the first half of bus clock cycle 1 beginning at approximately a rising edge at the beginning of bus clock cycle 1. Sub-phase b of the request (Ab) providing some auxiliary details for the transaction is sent on the second half of bus clock cycle 1 beginning at approximately the 50% point of bus clock cycle 1. These two information elements are shown in FIG. 6a as the two rectangles for Aa and Ab for the A# (@driver) lines (Aa indicates sub-phase a of the request provided over the Address lines, while Ab indicates sub-phase b of the request provided over the Address lines). Thus, the address bus is double pumped because two information elements (Aa and Ab) are transferred or sent during one bus clock cycle.

In addition, because the information for the request will be sent using a double pumped signaling mode (two information elements per bus clock cycle), the information is preferably sent as a source synchronous transfer. Thus, in addition to the two information elements, the driver also drives or activates an address strobe signal to provide two address strobes per bus clock cycle (when activated). The address strobes provide or identify points for sampling the two information elements (Aa and Ab) sent on the address bus.

According to an embodiment, an address strobe signal (ADSTB#) is used that is the same frequency as the bus clock (BCLK). However, to provide two strobes during the one bus clock cycle, both falling edges and rising edges of the address strobe signal will be used as strobes or to identify sampling points for the two information elements provided over the address bus. As shown in FIG. 6a, the driver activates an address strobe signal (ADSTB#) at approximately the 25% point of bus clock cycle 1, which is the center of information element 1 (Aa). According to an embodiment, the address strobe for the first information element (Aa or sub-phase a of the request) is provided as the falling edge of the ADSTB# signal (driven at the 25% point of bus clock cycle 1), while the address strobe for the second information element (Ab or sub-phase b of the request) is provided as the rising edge of the ADSTB# signal (driven at approximately the 75% point of bus clock cycle 1).

Even though the address strobe has a frequency that is the same as the bus clock, the bus clock is not used in some embodiments as the strobe signal for the information elements because the bus clock signal may not provide rising and falling edges at the appropriate times. Moreover, the bus clock signal is always activated (as opposed to a strobe signal that is activated only during a source synchronous transfer). The address strobe signal is used to provide strobes or sampling points for the two information elements because the address strobe signal can be activated (turned on) and de-activated (turned off) regardless of the state or phase of the bus clock. By having the strobe driven from the same source as the information, the delay in the strobe matches the delay in the information, and hence allows more than one bit to be on a wire at the same time.

The information elements (Aa and Ab) and the address strobe signal propagate along the processor bus 117 and arrive at the receiver at the beginning of bus clock cycle 2. As shown in FIG. 6a, the first information element (Aa) is captured or sampled on the falling edge of the ADSTB# (@receiver) signal and the second information element is captured or sampled on the rising edge of the ADSTB# (@receiver) signal, as shown by the two triangles on the ADSTB#(@receiver) signal. Thus, it can be seen that the receiver deterministically captures the data or information based on an indication from the driver when the data is valid (and should be captured).

According to an embodiment, the latency of the data transfer from the driving agent to any receiver should be less than or equal to one bus clock cycle minus the input latch setup time. This should avoid contention on the address lines (or address bus) and other lines for the second or subsequent phase if the receiver becomes owner of the next phase. The net effect is twice the bandwidth of common clock signaling mode with the effect of adding latency for the first signal group being latched inside the component or receiver.

According to an embodiment, the receiver includes a four element FIFO buffer for storing four information element transmitted over the address bus during the request phase. This allows elements from sub-phase a and sub-phase b of one request to be received and captured in the FIFO, while allowing at the same time elements from a sub-phase a and a sub-phase b of a previous request to be read out of the FIFO and latched at the receiver.

Therefore, according to an embodiment, a single address strobe signal is used at the same frequency as the bus clock to provide the strobes for the two information elements transferred over the address bus. At these frequencies for the address strobe (the same frequency as the bus clock signal), signal attenuation is not a problem. Moreover, any asymmetry in the strobe duty cycle does not pose a problem because only two information elements are transmitted per bus clock cycle. Hence, a single address strobe at the same frequency as the bus clock in which both falling and rising edges are used as strobes can be used for the address strobe signal.

Alternatively, multiple (or two) address strobe signals can be used, with only one of the edges of each address strobe signal being used as a strobe. For example, a first address strobe signal activated (having a falling edge) at the 25% point of cycle 1 and a second address strobe signal activated (having a falling edge) at the 75% point of cycle 1 could be used. Thus, the activation points of the two address strobe signals would be offset or staggered. Because only two elements are driven during one bus clock cycle, the frequency of the address strobe signals could be chosen to be the same as the bus clock frequency, or another frequency.

Figure 6B:
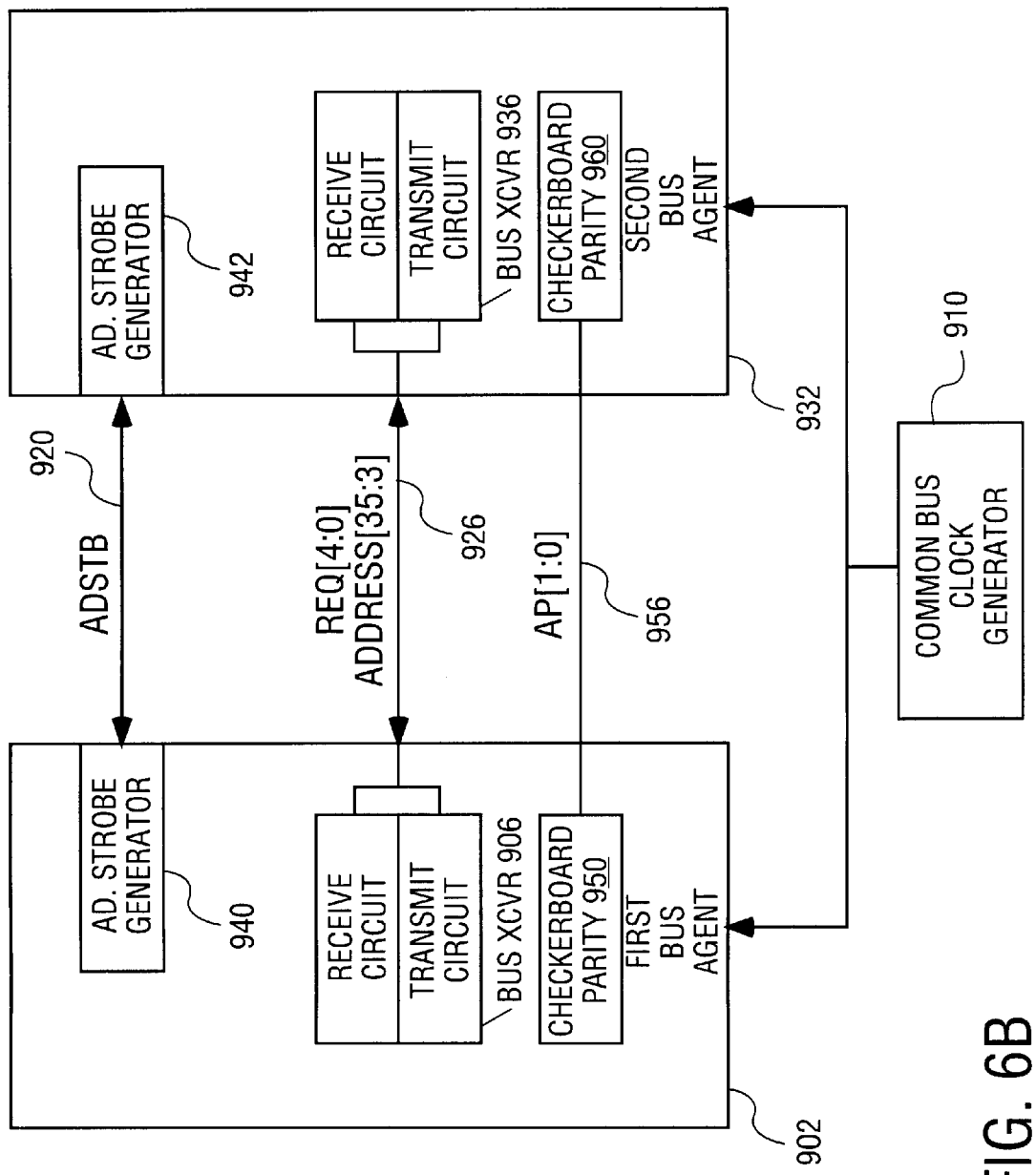
FIG. 6b is a block diagram of an apparatus for multi-pumped transfer of information between agents according to an embodiment.

FIG. 6b is a block diagram of an apparatus for transferring information between agents according to an embodiment. A first bus agent 902 is connected to a second bus agent 932. The first bus agent 902 includes an address strobe generator/receiver for generating and receiving a first address strobe signal (e.g., ADSTB[1]#) over a first bidirectional address strobe signal line 920. Bus agent 902 also includes a bus transceiver 906 including a transmit circuit for transmitting or driving address and request signals onto the address and request bus or address bus signal lines 926 and a receive circuit for receiving data signals received over the address signal lines 926. The second bus agent 932 similarly includes an address strobe generator an address strobe signal onto the address strobe signal line 920. A common (or system) bus clock generator 910 provides the common or system bus clock to bus agents 902 and 932.

Each bus agent 902 and 932 contains a checkerboard parity circuit, respectively checkerboard parity circuits 950 and 960, to generate and check parity signals that in one embodiment are transmitted over a data parity bus 956 according to the common clock protocol.

In one embodiment, the address parity signals AP[1:0] shown in FIG. 6b are transmitted according to the common clock protocol as are other control signals. Additionally, in one embodiment, the address parity signals are transmitted in a bus clock cycle after the address and request information is transferred. Since the parity signals are themselves not double-pumped, an innovative technique to preserve parity information may be advantageous.

Figure 7:
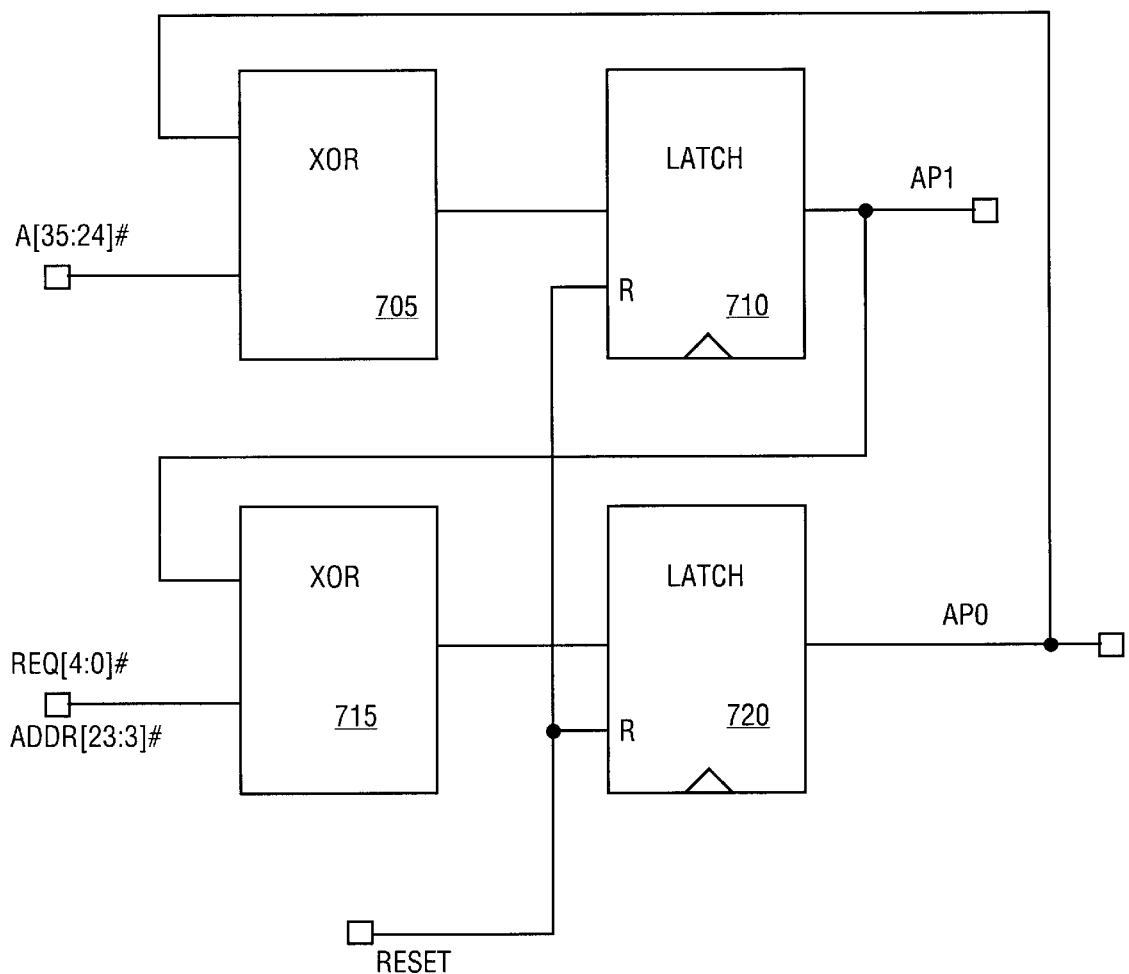
FIG. 7 is one embodiment of a parity generation circuit that may be used to generate address and request parity signals in one embodiment.

FIG. 7 illustrates one embodiment of an appropriate parity generation circuit for a double pumped address and request bus. In the embodiment of FIG. 7, parity information is preserved across the multiple sub-phases of the request phase by compounding information. In particular, parity information for one request sub-element from one sub-phase is combined with parity information for a different sub-element from the other sub-phase.

In particular, address bits A[35:24]#, collectively a sub-element (a first fixed portion of the address and request buses), are exclusive ORed by an exclusive OR gate 705 together with an AP0 input from a latch 720. An output of the exclusive OR gate 705 is fed to an input of a latch 710, which captures the value at the next clock cycle. Similarly, address bits A[23:3]#, REQ[4:0]# (a second fixed portion forming a second sub-element) are exclusive ORed by an exclusive OR gate 715 together with an AP1 input from the latch 710. An output of the exclusive OR gate 715 is fed to an input of the latch 720, which captures the value at the next clock cycle.

In one embodiment, both the latches 710 and 720 are reset at the beginning of a new request phase as indicated by a RESET signal provided to a reset input of each latch. The latches 710 and 720 may be clocked by an internal clock that operates at a higher frequency than the bus clock signal, thereby compounding the parity information over several internal cycles. The AP0 and AP1 signals may be latched, gated, or otherwise synchronized to the bus clock prior to external transmission so their timing appropriately matches the common clock timing protocol. In one embodiment, the request phase parity signals AP0 and AP1 are transmitted in a single bus clock cycle subsequent to the bus cycle in which the address elements are generated.

Thus, the parity is generated according to the following tables (note that phase refers to the two segments or sub-phases of the double-pumped request phase).

|                              | Phase 1 | Phase 2 |
|------------------------------|---------|---------|
| XOR (A[35:24]#)              | AP0     | AP1     |
| XOR (A[23:0]#, REQ[4:0]#)    | AP1     | AP0     |

In other embodiments, other signal sets may be combined to generate parity signals across multiple phases (sub-phases). For example, there may be more or fewer address bits, and these may be combined in different sets (e.g., three, four, or another number of sets). Additionally, known parity or error correction functions other than exclusive OR may be used.

Data (Transfer) Phase

During the Data phase, data is transferred between different bus agents over the processor bus 117. Based on the request phase, a transaction either contains a "request-initiated" (write) data transfer, a "response-initiated" (read) data transfer, or no data transfer. The data phase may overlap with the request phase for a transaction. Below is an example list of signals that can be used in the data phase:

| EXAMPLE DATA SIGNALS | | |
|---|---|---|
| Type | Signal Names | Number |
| Data Ready | DRDY# | 1 |
| Data Bus Busy | DBSY# | 1 |
| Data Strobes | DSTBp[3:0]# DSTBp[3:0]# | 8 |
| Data | D[63:0]# | 64 |
| Data Inversion | DINV[3:0]# | 4 |
| Data parity | DP[3:0]# | 4 |

DRDY# indicates that valid data has been placed on the bus 117 to be latched. The data bus owner asserts DRDY# for each bus clock cycle in which valid data is to be transferred. DRDY# can be deasserted to insert wait states in the data phase. DBSY# can be used to hold the data bus before the first DRDY# assertion and between subsequent DRDY# assertions for a multiple bus clock data transfer. DRDY# and DBSY# are common clock (1×) protocol signals.

DINV[3:0]# are used to indicate that the data bits have been inverted by the data source. Data may be inverted by the data source in order to limit switching current. In one embodiment, the DINV signals assure that at most eight bits in a sixteen bit group are asserted (driven low) at a time. If more than eight bits would be asserted by the data presented to the data bus interface logic, the group of sixteen is inverted. Receivers in another bus agent receive the DINV signals along with the data and undo any inversions indicated by the DINV signals. The DINV signals are quad pumped to deliver inversion information for each data sub-phase.

The data signals D[63:0]# of the data bus 206 (FIG. 2) provide a 64-bit data path between bus agents. For a partial transfer, including I/O read and I/O write transactions, the byte enable signals (BE[7:0]#) determine which bytes of the data bus will contain the valid data. The DP signals can be used to provide parity for the data signals.

According to an embodiment, data may be transferred using a quad pumped (i.e, 4×) source synchronous latched protocol in which the data signals D[63:0]# are used to transmit four 8-byte data elements in a single bus clock cycle. The first 8-bytes (in burst order) are transmitted in the first quarter of the bus clock, the second 8-byte element in the second quarter of the bus clock, the third 8-byte element in the third quarter of the bus clock and the fourth 8-byte element in the fourth quarter of the bus clock. The data can be transferred in the first quarter of the bus clock if the data to be transferred is 1 to 8 bytes in length, and the data can be transferred in the first two quarters of the bus clock if thee data is 9–16 bytes in length.

As indicated in the above table, four data parity signals are included in one embodiment (DP[3:0]#). Similarly to the address parity signals, AP[1:0]#, the data parity signals are transmitted using the common clock protocol. Since each data parity signal relates to multiple phases of a transfer, and since parity can be computed for a subset of the entire data bus, a checkerboard technique may be used. The checkerboard technique compounds parity results through the (sub) phases of the quad pumped data transfer. In one embodiment, the data parity signals provide parity coverage for D[63:0]# and DINV[3:0]# on the common clock cycle following DRDY# sampled active.

Figure 8:
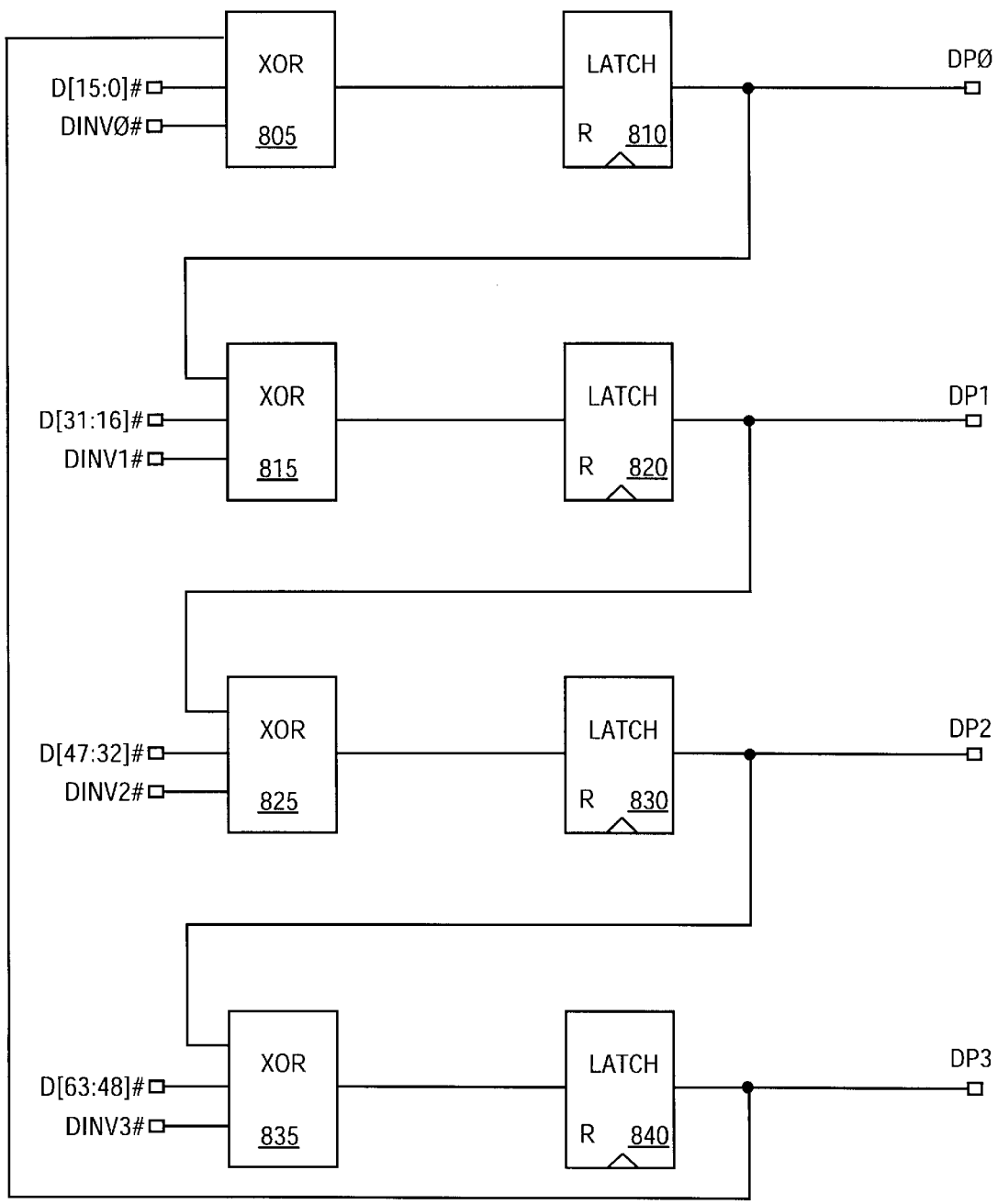
FIG. 8 is one embodiment of a parity generation circuit that may be used to generate data parity signals in one embodiment.

FIG. 8 illustrates one embodiment of a checkerboard parity generation circuit for a quad pumped bus. In the embodiment of FIG. 8, parity information is preserved across the multiple sub-phases of the data phase by compounding information. In particular, parity information for one request sub-element from one sub-phase is combined with parity information for different sub-elements from other sub-phases.

In particular, data bits D[15:0]# and DINV0# (a first fixed portion of the databus) are exclusive ORed by an exclusive OR gate 805 together with a DP3 input from a latch 840. An output of the exclusive OR gate 805 is fed to an input of a latch 810, which captures the value at the next clock cycle. Databits D[31:16]#, and DINV1# (a second fixed portion) are exclusive ORed by an exclusive OR gate 815 together with a DP0 input from the latch 810. An output of the exclusive OR gate 815 is fed to an input of a latch 820, which captures the value at the next clock cycle. Data bits D[47:32]#, and DINV2# are exclusive ORed by an exclusive OR gate 825 together with a DP1 input from the latch 820. An output of the exclusive OR gate 825 is fed to an input of a latch 830, which captures the value at the next clock cycle. Finally, data bits D[63:48]#, and DINV3# are exclusive ORed by an exclusive OR gate 835 together with a DP2 input from the latch 830. An output of the exclusive OR gate 835 is fed to an input of a latch 840, which captures the value at the next clock cycle.

In one embodiment, the latches 810, 820, 830 and 840 are reset at the beginning of a new data phase. The latches 810, 820, 830 and 840 may be clocked by an internal clock that operates at a higher frequency than the bus clock signal, thereby compounding the parity information over several internal cycles. The DP0, DP1, DP2, and DP3 signals may be latched, gated, or otherwise synchronized to the bus clock prior to external transmission so their timing appropriately matches the common clock timing protocol.

Thus, the parity is generated according to the following tables (note that phase refers to the four segments or sub-phases of the quad-pumped data phase).

|  | Phase 1 | Phase 2 | Phase 3 | Phase 4 |
|---|---|---|---|---|
| XOR (D[15:0]#, DINV0#) | DP3 | DP2 | DP1 | DP0 |
| XOR (D[31:16]#, DINV1#) | DP0 | DP3 | DP2 | DP1 |
| XOR (D[47:32]#, DINV2#) | DP1 | DP0 | DP3 | DP2 |
| XOR (D[63:48]#, DINV3#) | DP2 | DP1 | DP0 | DP3 |

As noted with respect to the address parity generation, in other embodiments, other signal sets (i.e., different fixed portions than shown in column 1 of the tables above) may be combined to generate parity signals across multiple (sub)phases. For example, there may be more or fewer data bits, and these may be combined in different sets (e.g., three, four, or another number of sets). Additionally, known or otherwise available parity or error correction functions other than exclusive OR may be used. Furthermore, the bus inversion feature may be turned off or not included at all, and accordingly the DINV signals may not be used in parity calculations. Additionally, given the disclosed techniques to generate parity, one of skill in the art will recognize that parity checking can be performed by a receiver using similar computational techniques.

Figure 9:
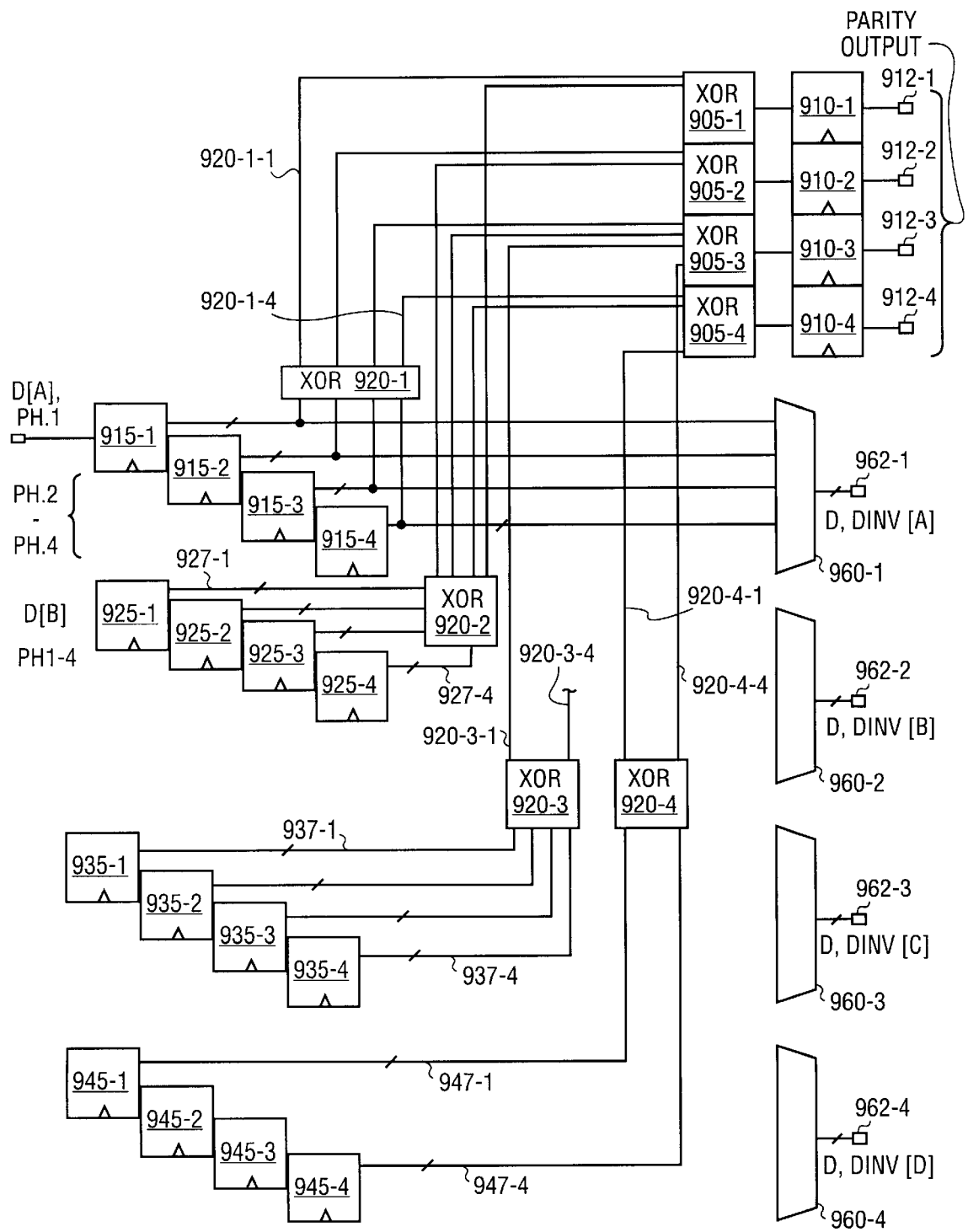
FIG. 9 is an alternative embodiment of a parity generation circuit.

FIG. 9 illustrates one alternative embodiment for computing data parity. The embodiment of FIG. 9 may be useful in the absence of higher frequency internal clocks to compute parity over a number of higher frequency clock cycles prior to high speed (e.g., multi-pumped) transmission. In the embodiment of FIG. 9, each data element is stored, and data parity is computed for all elements in one clock cycle. The parity may then be driven out in the next bus clock cycle.

In the embodiment of FIG. 9, data and optional data inversion signals are split into four different groupings, A–D. In one embodiment each grouping includes 16 data bits and one data inversion signal; however, other numbers of signals may be used. Four parity outputs 912-1 through 912-4 each reflect parity information for each one of the four groups in one phase. A first set of latches 915-1 to 915-4 receives data group A signals. Latches 915-1 receive the data group A signals for the first phase of a quad pumped data transfer, whereas latches 915-2 receive data group A signals for the second phase, and likewise latches 915-3 and 915-4 receive data group A signals for the third and fourth phases, respectively. Different data elements are received for each phase and latched into the four latches 915-1 through 915-4 for sequential transmission. For example, in one embodiment, data group A includes D[15:0]# and DINV0#, and the latches 915-1 through 915-4 receive, via separate data path connections, D[15:0]# and DINV0# for four phases, with latches 915-1 latching D[15:0]# and DINV0# for the first phase, latches 915-2 latching D[15:0]# and DINV0# for the second phase, latches 915-3 latching D[15:0]# and DINV0# for the third phase, and latches 915-4 latching D[15:0]# and DINV0# for the fourth phase.

An XOR circuit 920-1 performs an exclusive OR function for outputs of each of the latches 915-1 through 915-4. Therefore, in one embodiment, the XOR 920-1 includes four 17:1 XOR circuits, one for each 17 bit output of latches 915-1 through 915-4. The outputs of latches 915-1 through 915-4 are also fed to a multiplexer 960-1 which selects an appropriate set of latch outputs from latches 915-1 through 915-4 for each phase of data transfer on outputs 962-1.

According to one embodiment, outputs of the XOR circuit 920-1 are single bits provided on signal lines 920-1-1 through 920-1-4. The first signal line 920-1-1 is coupled to a first XOR gate 905-1. Likewise, the second signal line 920-1-2 is coupled to a second XOR gate 920-2, and the third signal line 920-1-3 and the fourth signal line 920-1-4 are respectively coupled to a third XOR gate 905-3 and a fourth XOR gate 905-4. The outputs of XOR gates 905-1 to 905-4 are provided to a set of latches 910-1 to 910-4 to provide output parity signals on a subsequent bus clock cycle on the parity outputs 912-1 through 912-4. Thus, parity from data group A impacts all four data parity outputs because each different phase of data group A is provided to a different XOR gate which feeds into a different output parity signal.

Similarly, for data group B, latches 925-1 through 925-4 receive the four data group B signals for the four transfer phases. Outputs of latches 925-1 through 925-4 are labeled 927-1 through 927-4. These outputs are routed to an XOR circuit 920-2 which is connected and functions similarly to the XOR circuit 920-1 discussed above. Additionally, the latch outputs 927-1 through 927-4 are coupled to a multiplexer 960-2 (connections not shown to avoid cluttering figure) which generates outputs 962-2 as described above with respect to multiplexer 960-1. The single bit output of the XOR circuit 920-2 representing the XOR of latch outputs 927-1 is routed to XOR gate 905-2. Similarly, the single bit output of the XOR circuit 920-2 representing the XOR of latch outputs is routed to XOR gate 905-3, and the single bit outputs for latch outputs 927-3 and 927-4 are respectively routed to XOR gates 905-4 and 905-1.

For data groups C and D, a similar arrangement exists; however, numerous wires are omitted to avoid cluttering of the drawing. For groups C and D, latches 935-1 through 935-4 and latches 945-1 through 945-4 respectively latch data signals for each of the four phases. For groups C and D, XOR circuits 920-3 and 920-4 receive outputs from respectively latches 935-1 through 935-4 and 945-1 through 945-4 as previously described with respect to groups A and B.

The outputs of XOR circuits 920-3 and 920-4 are connected similarly the XOR circuit outputs for groups A and B; however, each phase's bit is routed to a different one of the XOR gates 905-1 through 905-4. Group C starts with the XOR result of latch outputs 937-1 on signal line 920-3-1 being routed to XOR gate 905-3. The second, third, and fourth bits are fed to XOR gates 905-4, 905-1, and 905-2. For example, the fourth signal line 930-3-4 carrying the XOR of the latch outputs 937-4 is to be connected to XOR 905-2 in this embodiment.

Similarly, the signals for data group D are connected in this sequential, wrap-around manner. Signal line 920-4-1, which conveys a representation of the XOR of latch outputs 947-1, is coupled to XOR gate 905-4, and signal line 920-4-4, which conveys a representation of the XOR of latch outputs 947-4, is coupled to XOR gate 905-3. Although not shown, connections would be provided to route the XOR of outputs from latches 945-2 and 945-3 respectively to XOR gates 905-1 and 905-2.

Again, this embodiment can perform parity evaluation in a single cycle for all data from all sub-phases of a single data transfer phase when that data is all available at one before or after transmission. Such single cycle evaluation may be advantageous in some cases. For example, a chipset may not have fast internal clocks that clock logic to perform parity evaluations at the quad pumped transfer rate. The parity may, however, be driven out in a later bus cycle in some embodiments. Additionally, some embodiments may use similar circuitry and use multiple clocks for parity evaluation due to clock period duration/speed path or other concerns or may compute parity over a number of clock cycles equivalent to the number of sub-phases of the transfer. Moreover, some embodiments may not use sequential wrap-around ordering of sub-elements, but still may use a different sub-element in each phase.

Thus, checkerboard parity techniques for a multi-pumped bus is disclosed. Advantageously, such techniques compact parity information while preventing single wire or single group errors from canceling themselves out due to the compaction. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A bus agent comprising:
   a multi-pumped bus interface to sequentially generate in a plurality of N phases a plurality of N elements, one element per phase, each of said plurality of N elements comprising a plurality of N sub-elements, each sub-element being a fixed portion of each element;
   a parity generation circuit to generate a plurality of parity signals, each parity signal being computed as a function of N sub-elements, each parity signal being a function of a different sub-element from each phase.

2. The bus agent of claim 1 wherein said plurality of N elements are generated in a source synchronous manner during a transfer time period equivalent to a bus clock cycle of a bus clock signal that operates at a bus clock frequency.

3. The bus agent of claim 2 wherein said plurality of N elements are generated in a first bus clock cycle and wherein said plurality of parity signals are all transmitted in a second bus clock cycle subsequent to the first bus clock cycle.

4. The bus agent of claim 1 wherein said plurality of parity signals are to be generated using a common clock protocol at a bus clock frequency.

5. The bus agent of claim 1 wherein said multi-pumped bus interface is a double pumped address and request bus interface.

6. The bus agent of claim 5 wherein said plurality of N elements comprises a first sub-element which is a plurality of address signals and a second sub-element which includes both request signals and address signals, and wherein said plurality of parity signals comprise two parity signals.

7. The bus agent of claim 6 wherein said first sub-element comprises a first group of address bits 35:24 and wherein said second sub-element comprises a second group of address bits 23:3 and a first group of request bits 4:0.

8. The bus agent of claim 1 wherein said multi-pumped bus interface is a quad pumped data bus interface, wherein N is 4 and said plurality of N elements comprise four data elements, and wherein said plurality of parity signals comprise four parity signals.

9. The bus agent of claim 8 wherein each data element comprises four data groups as sub-elements, wherein each data group comprises a plurality of data signals and a data inversion signal.

10. The bus agent of claim 9 wherein each data element comprises:
    a first data group comprising data bits 15:0 and data inversion bit 0;
    a second data group comprising data bits 31:16 and data inversion bit 1;
    a third data group comprising data bits 47:32 and data inversion bit 2;
    a fourth data group comprising data bits 63:48 and data inversion bit 3.

11. A method comprising:
    providing a plurality of elements in a plurality of phases, one element per phase, each element having a plurality of N sub-elements in fixed positions with respect to each element;
    computing a plurality of N parity signals, each of said plurality of N parity signals being a function of N different sub-elements, each of said N different sub-elements being from a different one of said plurality of phases.

12. The method of claim 11 wherein said plurality of elements are generated sequentially in a source synchronous manner during a transfer time period equivalent to a bus clock cycle of a bus clock signal that operates at a bus clock frequency.

13. The method of claim 12 further comprising:
    transmitting said plurality of N parity signals in a single bus cycle using a common clock protocol at the bus clock frequency.

14. The method of claim 11 wherein providing comprises generating a first request element and a second request element in respectively a first phase and a second phase, each element comprising a first sub-element and a second sub-element, and wherein computing comprises:
    computing a first parity signal as an exclusive OR of said first sub-element of the first request element from the first phase and the second sub-element from the second request element from the second phase;
    computing a second parity signal as an exclusive OR of said second sub-element of the first request element from said first phase and said first sub-element from said second request element from said second phase.

15. The method of claim 11 wherein providing comprises generating a first data element, a second data element, a third data element, and a fourth data element in respectively a first phase, a second phase, a third phase, and a fourth phase, each data element have a first sub-element, a second sub-element, a third sub-element, and a fourth sub-element, and wherein computing comprises:
    computing a first parity signal as a function of said first sub-element of the first data element from the first phase and the second sub-element from the second data element from the second phase and the third sub-element from the third data element from the third phase and the fourth sub-element from the fourth data element from the fourth phase;
    computing a second parity signal as function of said second sub-element of the first data element from the first phase and the third sub-element from the second data element from the second phase and the fourth sub-element from the third data element from the third phase and the first sub-element from the fourth data element from the fourth phase;
    computing a third parity signal as a function of said third sub-element of the first data element from the first phase and the fourth sub-element from the second data element from the second phase and the first sub-element from the third data element from the third phase and the second sub-element from the fourth data element from the fourth phase;

computing a fourth parity signal as a function of said fourth sub-element of the first data element from the first phase and the first sub-element from the second data element from the second phase and the second sub-element from the third data element from the third phase and the third sub-element from the fourth data element from the fourth phase.

16. A bus agent comprising:

a quad pumped data bus interface to sequentially generate a first data element, a second data element, a third data element, and a fourth data element in a source synchronous manner during a data transfer time period equivalent to a bus clock cycle of a bus clock signal that operates at a bus clock frequency;

a parity generation circuit to generate a parity signal that is a multi-bit signal, each bit of the multi-bit signal being a function of the first data element, the second data element, the third data element, and the fourth data element, said parity signal to be generated in a single bus clock cycle using a common clock protocol at the bus clock frequency.

17. The bus agent of claim 16 wherein said parity signal is to be generated in the single bus clock cycle subsequent to a bus cycle in which said first data element, said second data element, said third data element, and said fourth data element are generated.

18. The bus agent of claim 16 wherein said quad pumped data bus interface is also to sequentially transmit a first plurality of data inversion signals to indicate whether sub-elements of the first data element have been inverted, a second plurality of data inversion signals to indicate whether sub-elements of the second data element have been inverted, a third plurality of data inversion signals to indicate whether sub-elements of the third data element have been inverted, and a fourth plurality of data inversion signal to indicate whether sub-elements of the fourth data element have been inverted, wherein said parity signal is a function of said first through fourth data inversion signals and said first through fourth data elements.

19. The bus agent of claim 18 wherein each data element comprises four sub-elements, a first sub-element, a second sub-element, a third sub-element, and a fourth sub-element, each sub-element being associated with a data inversion signal and together with said data inversion signal being a fixed portion of an element.

20. The bus agent of claim 19 wherein said parity generation circuit is to generate:

a first parity signal as a function of said first sub-element of the first data element from a first phase and the second sub-element from the second data element from a second phase and the third sub-element from the third data element from a third phase and the fourth sub-element from the fourth data element from a fourth phase;

a second parity signal as a function of said second sub-element of the first data element from the first phase and the third sub-element from the second data element from the second phase and the fourth sub-element from the third data element from the third phase and the first sub-element from the fourth data element from the fourth phase;

a third parity signal as a function of said third sub-element of the first data element from the first phase and the fourth sub-element from the second data element from the second phase and the first sub-element from the third data element from the third phase and the second sub-element from the fourth data element from the fourth phase;

a fourth parity signal as a function of said fourth sub-element of the first data element from the first phase and the first sub-element from the second data element from the second phase and the second sub-element from the third data element from the third phase and the third sub-element from the fourth data element from the fourth phase.

21. An apparatus comprising:

a first plurality of data signal interfaces;

a first data inversion signal interface;

a second plurality of data signal interfaces;

a second data inversion signal interface;

a third plurality of data signal interfaces;

a third data inversion signal interface;

a fourth plurality of data signal interfaces;

a plurality of four data parity signal interfaces;

a bus controller to sequentially transmit in four phases a first data element, a second data element, a third data element, and a fourth data element in a source synchronous manner during a data transfer time period equivalent to a bus clock cycle of a bus clock signal that operates at a bus clock frequency, each element having a first sub-element, a second sub-element, a third sub-element, and a fourth sub-element to be respectively transmitted on said first, second, third, and fourth plurality of data signal interfaces in conjunction with data inversion signals on said first, second, third, and fourth data inversion signal interfaces to indicate whether each sub-element has been inverted;

a data parity generation circuit coupled to the bus controller to generate:

a first parity signal on a first one of said plurality of four data parity signal interfaces as a function of said first sub-element of the first data element from a first phase and the second sub-element from the second data element from a second phase and the third sub-element from the third data element from a third phase and the fourth sub-element from the fourth data element from a fourth phase;

a second parity signal on a second one of said plurality of four data parity signal interfaces as function of said second sub-element of the first data element from the first phase and the third sub-element from the second data element from the second phase and the fourth sub-element from the third data element from the third phase and the first sub-element from the fourth data element from the fourth phase;

a third parity signal on a third one of said plurality of four data parity signal interfaces as a function of said third sub-element of the first data element from the first phase and the fourth sub-element from the second data element from the second phase and the first sub-element from the third data element from the third phase and the second sub-element from the fourth data element from the fourth phase;

a fourth parity signal on a fourth one of said plurality of four data parity signal interfaces as a function of said fourth sub-element of the first data element from the first phase and the first sub-element from the second data element from the second phase and the second sub-element from the third data element from the third phase and the third sub-element from the fourth data element from the fourth phase.

22. The apparatus of claim 21 further comprising an address parity generation circuit to generate:
   a first address parity signal as a function of first request sub-element of a first request element from a first request phase and a second request sub-element from a second request element from a second request phase;
   second address parity signal as a function of a second request sub-element of the first request element from the first request phase and a first address sub-element from said second request element from said second request phase.

23. A bus agent comprising:
   a multi-pumped bus interface to sequentially receive in a plurality of N phases a plurality of N elements, one element per phase, in a source synchronous manner during a transfer time period equivalent to a bus clock cycle of a bus clock signal that operates at a bus clock frequency, each of said plurality of N elements comprising a plurality of N sub-elements, each sub-element comprising a fixed portion of each element;
   a parity checking circuit to receive a plurality of N parity signals and to test whether each of said plurality of N parity signals is a correct function of N sub-elements, each sub-element being a different sub-element from each phase.

24. The bus agent of claim 23 wherein said plurality of N sub-elements is received in a single bus cycle after said plurality of N elements using a common clock protocol at the bus clock frequency.

25. A system comprising:
   a transmitting bus agent comprising:
      a multi-pumped bus interface to sequentially transmit in a plurality of N phases a plurality of N elements in a source synchronous manner during a transfer time period equivalent to a bus clock cycle of a bus clock signal that operates at a bus clock frequency, each of said plurality of elements comprising a plurality of N sub-elements, each sub-element comprising a fixed portion of each element;
      a parity generation circuit to generate plurality of parity signals, each parity signal being computed based on N sub-elements, each parity signal being a function of a different sub-element from each phase;
   a receiving bus agent comprising:
      a second multi-pumped bus interface to sequentially receive in said plurality of N phases said plurality of N elements in the source synchronous manner;
      a parity checking circuit to receive said plurality of parity signals, one parity signal per sub-element and to test whether each parity signal is a correct function of N sub-elements, each sub-element being a different sub-element from each phase.

26. The system of claim 25 wherein said plurality of parity signals are transmitted in a single bus cycle subsequent to a bus cycle in which said plurality of N elements are generated, said plurality of parity signals being transferred using the common clock protocol at the bus clock frequency.

* * * * *

UNITED STATES PATENT AND TRADEMARK OFFICE
CERTIFICATE OF CORRECTION

PATENT NO. : 6,742,160 B2  Page 1 of 1
DATED : May 25, 2004
INVENTOR(S) : Greiner It is certified that error appears in the above-identified patent and that said Letters Patent is hereby corrected as shown below:

Column 14,
Line 57, delete "APO" and insert -- AP0 --.

Signed and Sealed this

Twenty-seventh Day of July, 2004

JON W. DUDAS
*Acting Director of the United States Patent and Trademark Office*